United States Patent
Jaakkola et al.

(10) Patent No.: US 10,056,877 B2
(45) Date of Patent: Aug. 21, 2018

(54) TEMPERATURE COMPENSATED BEAM RESONATOR

(71) Applicant: Teknologian tutkimuskeskus VTT Oy, Espoo (FI)

(72) Inventors: Antti Jaakkola, Espoo (FI); Panu Pekko, Espoo (FI); Mika Prunnila, Espoo (FI); Tuomas Pensala, Espoo (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 272 days.

(21) Appl. No.: 14/874,522

(22) Filed: Oct. 5, 2015

(65) Prior Publication Data
US 2016/0099703 A1 Apr. 7, 2016

(30) Foreign Application Priority Data
Oct. 3, 2014 (FI) .................................... 20145868

(51) Int. Cl.
*H03H 9/24* (2006.01)
*H03H 3/10* (2006.01)
(Continued)

(52) U.S. Cl.
CPC ...... *H03H 9/02448* (2013.01); *H03H 9/2405* (2013.01); *H03H 9/2447* (2013.01); *H03H 3/0076* (2013.01); *H03H 2009/241* (2013.01)

(58) Field of Classification Search
CPC .......... H03H 9/02244; H03H 9/02448; H03H 9/02433; H03H 9/0571; H03H 9/2405;
(Continued)

(56) References Cited

U.S. PATENT DOCUMENTS 7,362,197 B2 * 4/2008 Lutz ...................... B81B 3/0072
333/186
7,591,201 B1 * 9/2009 Bernstein ............. H03H 3/0076
74/2
(Continued)

FOREIGN PATENT DOCUMENTS

WO  WO 2008043727 A1 *  4/2008
WO  WO 2012110708 A1 *  8/2012

OTHER PUBLICATIONS

Jaakkola A et al—Determination of doping and temperature-dependent elastic constants of degenerately doped silicon from MEMS resonators. IEEE Transactions on Ultrasonics, Ferroelectrics and Frequency Control, 2014, vol. 61 No. 7.
(Continued)

*Primary Examiner* — Edgardo San Martin
(74) *Attorney, Agent, or Firm* — Seppo Laine Oy

(57) ABSTRACT

The invention provides a microelectromechanical resonator device comprising a support structure and a resonator manufactured on a (100) or (110) semiconductor wafer, wherein the resonator is suspended to the support structure and comprises at least one beam being doped to a doping concentration of $1.1*10^{20}$ cm$^{-3}$ or more with an n-type doping agent and is being capable of resonating in a length-extensional, flexural resonance or torsional mode upon suitable actuation. In particular, the doping concentration and angle of the beam are chosen so as to simultaneously produce zero or close to zero second order TCF, and even more preferably zero or close to zero first and second order TCFs, for the resonator in said resonance mode, thus providing a temperature stable resonator.

22 Claims, 11 Drawing Sheets

(51) Int. Cl.
    *H03H 9/02* (2006.01)
    *H03H 3/04* (2006.01)
    *H03H 3/007* (2006.01)

(58) Field of Classification Search
    CPC ... H03H 2009/02527; H03H 2009/241; H03H 2009/2442; H03H 3/0076; H03H 3/0072; H03H 3/013; H03H 3/10
    See application file for complete search history.

(56) References Cited

U.S. PATENT DOCUMENTS

| | | | | |
|---|---|---|---|---|
| 8,558,643 | B2* | 10/2013 | Prunnila | B81B 3/0072 257/28 |
| 9,071,226 | B2* | 6/2015 | Jaakkola | H03H 9/02448 |
| 9,412,934 | B2* | 8/2016 | Lihola; Antti | H01L 41/39 |
| 9,553,561 | B2* | 1/2017 | Umeda | H03H 3/0072 |
| 9,559,660 | B2* | 1/2017 | Pensala | H03H 3/0076 |
| 9,695,036 | B1* | 7/2017 | Berger | B81B 3/0024 |
| 9,712,128 | B2* | 7/2017 | Doll | H03H 9/17 |
| 9,742,373 | B2* | 8/2017 | Raieszadeh | H01L 23/34 |
| 2007/0024158 | A1* | 2/2007 | Bourgeois | H03H 9/02259 310/321 |
| 2009/0307884 | A1* | 12/2009 | Duwel | H03H 3/02 29/25.35 |
| 2010/0127596 | A1* | 5/2010 | Ayazi | H03H 3/0077 310/300 |
| 2011/0204999 | A1* | 8/2011 | Phan Le | H03H 9/02259 333/200 |
| 2011/0210801 | A1* | 9/2011 | Rottenberg | G01K 7/32 331/156 |
| 2012/0286903 | A1* | 11/2012 | Prunnila | B81B 3/0072 333/234 |
| 2013/0187724 | A1* | 7/2013 | Jaakkola | H03H 9/02448 331/158 |
| 2014/0077898 | A1* | 3/2014 | Pensala | H03H 3/0076 333/187 |
| 2014/0313866 | A1* | 10/2014 | Hessler | H03H 3/0076 368/202 |
| 2016/0099702 | A1* | 4/2016 | Jaakkola | H03H 9/02448 310/300 |
| 2016/0099703 | A1* | 4/2016 | Jaakkola | H03H 9/02448 310/300 |
| 2016/0099704 | A1* | 4/2016 | Jaakkola | H01L 41/18 310/321 |

OTHER PUBLICATIONS

Jaakkola A et al—Long term stability and quality factors of degenerately n-type doped silicon resonators. 2014 IEEE International Frequency Control Symposium (FCS), May 19-22, 2014.

Shahmohammadi M. et al—Turnover temperature point in extensional-mode highly doped silicon microresonators. IEEE Transactions of Electron Devices, 2013, vol. 60 No. 3.

Shahmohammadi M. et al—Zero temperature coefficient of frequency in extensional-mode highly doped silicon microresonators. 2012 IEEE International Frequency Control Symposium (FCS) May 21-24, 2012.

* cited by examiner

1st order (100) in-plane, flexural mode of a beam with
dimensions 320 μm x 5 μm x 10 μm (L x W x H)

5th order (100) out-of-plane, flexural mode of a beam with
dimensions 320 μm x 5 μm x 10 μm (L x W x H)

1st order torsional mode, (110) plane beam length along [110]

1st order torsional mode, (100) plane beam length along [110]

TEMPERATURE COMPENSATED BEAM RESONATOR

FIELD OF THE INVENTION

The invention relates to microelectromechanical resonators. In particular, the invention relates to adjusting temperature coefficient of frequency (TCF) of beam-containing resonators.

BACKGROUND OF THE INVENTION

Widely used quartz crystal based resonators can potentially be replaced by micromechanical, typically silicon-based, resonators in many applications. Silicon resonators can be made smaller than quartz resonators and there are a plurality standard manufacturing methods for silicon resonators. However, a problem associated with silicon based resonators is that they have a high temperature drift of the resonance frequency. The drift is mainly due to the temperature dependence of the Young modulus of silicon, which causes a temperature coefficient of frequency (TCF) approx. −30 ppm/C. This causes the resonance frequency to fluctuate due to changes in ambient temperature.

As concerns the TCF, both the linear, i.e. $1^{st}$ order, and $2^{nd}$ order behaviors are important in practice, since the first one represents local change of frequency on temperature change (ideally zero) and the second one, describing the curvature of the frequency vs. temperature curve, represents the width of the low-drift temperature range. If the first order term is zeroed, the frequency drift comes from the second order term alone, there being a certain "turnover temperature", where the TCF achieves its absolute minimum value. The $2^{nd}$ order TCF is herein also denoted $TCF_2$ in contrast to 1st order coefficient $TCF_1$ (linear TCF). AT-cut quartz crystals have near-zero low $TCF_1$ and $TCF_2$ at 25° C., their total frequency drift typically being within +−10 ppm over a wide temperature range of −40° C. . . . +85° C. (so-called industrial range). The temperature performance of silicon resonators is considerably worse at the present.

One promising approach to remove or mitigate the problem of temperature drift is extremely heavy doping of silicon. The effect of homogeneous n-type doping of concentration greater than $10^{19}$ cm$^{-3}$ on bulk acoustic wave (BAW) resonator behavior has been discussed for example in WO 2012/110708. The document discusses that $TCF_1$ of a "pure" $c_{11}$-$c_{12}$ mode ($c_{11}$, $c_{12}$ and $c_{44}$ are elastic terms of the Young modulus of silicon) stays well above zero, and thus the frequency is still very dependent on temperature. However, other BAW resonance modes such as a square extensional (SE) or width extensional (WE) mode, have such dependence on elastic parameters $c_{11}$, $c_{12}$ (and $c_{44}$), that the linear TCP can be made zero by correct selection of their in-plane geometry aspect ratio.

As concerns beam resonators, WO 2012/110708 teaches for example that $1^{st}$ order TCP of beam resonators is minimized in extensional and flexural modes if the n-dopant concentration is between $1.6*10^{19}$ and $5*10^{19}$ cm$^{-3}$ and the rotation angle in the wafer plane between 0 and 25 degrees from the [100] crystal direction in the (100) or (110) plane. Thus, there is a single point of temperature within these ranges at which there is no temperature drift of frequency. The document, however, does not teach how to achieve a broader stable temperature range of operation, i.e., how to minimize the $2^{nd}$ order TCF. Also Jaakkola et al, "*Determination of Doping and Temperature Dependent Elastic Constants of Degenerately Doped Silicon from MEMS Resonators*", *IEEE Transactions on Ultrasonics, Ferroelectrics, and Frequency Control* Vol. 61, No. 7, pp 1063-1074, July 2014 suggests and shows by experiments that at least Lame plate resonators and length-extensional beam resonators can be effectively first order temperature compensated at an n-doping level greater than $2*10^{19}$ cm$^{-3}$.

Another approach is to form an effective material structure with superimposed layers having different doping levels or crystal orientations, as discussed in U.S. Pat. No. 8,558,643. The structure forms a superlattice capable of carrying a resonance mode whose TCP is considerably less that of an undoped or homogeneously doped corresponding silicon element. Such structure can be also be used to decrease the $2^{nd}$ order TCP to some extent so that temperature drift of less than 50 ppm over a 100° C. range is achieved.

The abovementioned documents cite also other documents utilizing silicon doping and briefly discusses also other methods to deal with the temperature drift problem.

The temperature behavior of a resonator is not only dependent on the doping concentration, but also on its geometry, crystal orientation and resonance mode excited therein, to mention some important factors. In addition, factors that need to be taken into account are the Q-value of the resonator, in which anchoring of the resonator plays an important role, and ability to manufacture the resonator design in practice. Low TCF and high Q-value may be contradictory design objectives using known resonator designs, since they are generally achieved with different geometrical layouts, for example.

At the present, there are only few practically feasible low-TCF silicon resonator designs available, some of which are disclosed in WO 2012/110708 and U.S. Pat. No. 8,558,643. However, there is a need for new and improved practically feasible designs, which allow for better control of TCF characteristics and simultaneously high Q-value. A simple structure and manufacturing process are also desirable.

SUMMARY OF THE INVENTION

It is an aim of the invention to provide a resonator device having high stable operating frequency in varying temperatures. In particular, it is an aim to provide a resonator whose first and second order TCFs are low in magnitude.

The invention is based on manufacturing, on a relatively heavily n-doped semiconductor wafer, a beam-shaped resonator element, which is typically tilted with respect to the crystal lattice in the plane of the wafer. It has been known that the first order TFC of a tilted beam resonator can be zeroed, but now it has been found that there exists a doping level and tilting angle combination within certain limits at which the first and second order TFCs are simultaneously zeroed in certain resonance modes.

Thus, the invention provides a microelectromechanical resonator device comprising a support structure and a resonator manufactured on a (100) or (110) semiconductor wafer, wherein the resonator is suspended to the support structure and comprises at least one beam being doped to a doping concentration of $1.1*10^{20}$ cm$^{-3}$ or more with an n-type doping agent and is being capable of resonating in a length-extensional, flexural or torsional mode upon suitable actuation. In particular, the doping concentration and angle of the beam are chosen so as to simultaneously produce zero or close to zero second order TCF, and even more preferably zero or close to zero first and second order TCFs, for the resonator in said resonance mode.

According to one aspect, the resonance mode concerned is flexural or length-extensional and the longitudinal axis of the beam is oriented at an angle of 17±10 degrees with respect to the [100] crystal direction. This allows for passive zeroing of both $TCF_1$ and $TCF_2$ for first and higher order flexural and first and higher order length-extensional modes.

According to another aspect, the resonance mode concerned is torsional and the longitudinal axis of the beam is oriented at an angle of 0±35 degrees with respect to the [110] crystal direction. This allows for passive zeroing of both $TCF_1$ and $TCF_2$ for at least first order torsional mode. The angle can be for example ±5 . . . 35 degrees, i.e. moderately tilted with respect, to the [1.10] direction. In an embodiment, the out-of-plane aspect ratio of the beam is chosen to minimize both $TCF_1$ and $TCF_2$ for a given angle. The aspect ratio can be for example less than 2, and in particular less than 1.5. In particular, for torsional beams in the (110) plane, the out-of-place aspect ratio can be less than 1.3, such as 0.1 . . . 1.2 and for torsional beams in the (100) plane, the out-of-plane aspect ratio can be less than 1, such as 0.1 . . . 0.9. In the latter case, the angle range within which both zero $TCF_1$ and $TCF_2$ can be found is somewhat smaller, i.e., 0±20.

More specifically, the invention is characterized by what is stated in the independent claim.

In particular, the doping concentration, beam orientation and resonance mode are chosen within the abovementioned limits so that the first order temperature coefficient of frequency ($TCF_1$) of the resonator is 1 ppm/C or less and the second order temperature coefficient of frequency ($TCF_2$) is 12 ppb/$C^2$ or less at least at one temperature. Preferably said at least one temperature comprises 25° C. which represents roughly a middle value of the industrial temperature range (−40 . . . 85° C.), corresponding to a temperature where the vertex of the change of frequency vs. temperature curve is positioned. Second order frequency drift of 12 ppb/$C^2$ or less corresponds to a total frequency drift of about 50 ppm or less over the industrial range.

In particular, the $TCF_2$ can be 6 ppb/$C^2$ or less (in absolute value) and even 3 ppb/$C^2$ or less at least at one temperature, corresponding to total drifts over the industrial range of 25 ppm and 12 ppm, respectively. $TCF_1$ is preferably 0.5 ppm/C or less.

The beam part of the present resonator can be a flexural, torsional or length-extensional spring element that is attached to the substrate and/or neighboring beams or other element(s) part of the resonator from its center, one or more ends or from one or more other points at its perimeter. In the case of flexural or length-extensional modes, the beam needs to be tilted, whereas for torsional modes, a specific $TCF_1=TCF_2=0$ cross-sectional beam geometry exists also for a non-tilted beam. The invention is not limited to single-beam resonators but covers also resonators that comprise two or more such beams. There may also be other elements in the resonator that are not beam-shaped or that are beams but not oriented at the abovementioned angle range. Several practical geometries are exemplified later in this document.

The invention provides considerable advantages. Most importantly, within the disclosed doping concentration and beam orientation, one can produce a beam and further a whole resonator whose second and optionally also first order TCFs are zero or close to zero in one of the disclosed resonance modes. Thus, the resonator has high frequency stability at varying temperatures.

From a practical point of view, passive zeroing of $TCF_2$ is more crucial, because non-linear frequency behavior more difficult to compensate using e.g. active compensation circuits than the linear behavior.

It should be noted that although the first and second order TCFs can be zeroed separately relatively easily, their simultaneous zeroing in the particular resonance modes herein discussed occurs only at certain geometries and relatively narrow parameter ranges herein disclosed. There are no specific teachings in the literature concerning simultaneous zeroing of $TCF_1$ and $TCF_2$, this however being an important aspect of the present invention.

The invention is realizable using n-type doping concentration provably achievable in practice. Compared with superlattice structures with different material properties in different layers stacked on top of each other, the present resonator element can be manufactured as a monolithic one-layer element, whereby its manufacturing is straightforward. Also the required dopant concentrations are smaller than that would be needed for a superlattice realization. One can also avoid complex active temperature compensation circuits around the resonator, since the resonator is inherently designed to meet the required frequency stability level.

The dependent claims are directed to selected embodiments of the invention.

According to one embodiment, the resonator comprises only one beam. The beam is oriented, doped and adapted to resonate as described above. The resonator may also be essentially comprised of that beam, whereby it is directly suspended to the support structure and the only resonating element of the resonator device. This is perhaps the simplest form of the invention in which the first and second order TCFs can be zeroed.

According to an alternative embodiment, the resonator comprises at least two beams oriented, doped and adapted to resonate as described above. The beams may be parallel, like in a so-called "tilted tuning fork" geometry or alternatively non-parallel, i.e. at a non-zero angle with respect to each other, like in a so-called "symmetrized tuning fork" geometry. Indeed, the invention allows for symmetrizing the whole structure with respect to the crystal lattice and therefore avoiding parasitic resonances in the resonator and improving quality factor of the resonator.

More specifically, according to one particular embodiment, the resonator comprises at least two length-extensional or flexural beams whose longitudinal axes are oriented at an angle of 17±10 degrees, such as 17±8 degrees, in particular 17±5 degrees, with respect to the [100] direction of the wafer, and the whole resonator has an axis of symmetry along the [100] direction. In the case of torsional-mode beams, the longitudinal axes are oriented at an angle of 0±35 degrees, in particular ±5 . . . 35 degrees, with respect to the [110] direction of the wafer, and the whole resonator has an axis of symmetry along the [110] direction.

Symmetric resonator according to the above embodiments can be in practice implemented in a plurality of ways. According to one option, the beams are connected to each other from their ends. Two beams may be arranged in V-formation and if there are more that two beams, they may for example be arranged in ring formation.

According to another option, there are two beams that are from their first ends connected to a common base portion having an axis of symmetry essentially parallel with the [100] (length-extensional or flexural beam) or [110] (torsional beam) direction of the wafer, and extend from the common base portion at equal angles with respect to the [100] or [110] direction of the wafer, respectively, but at opposite sides of said direction in the plane of the wafer (i.e., the beams are at "mirrored" orientations with respect to the [100] or [110] direction).

According to a still another option, the beams intersect each other. In this case, the intersecting beams are preferably suspended to the support structure at their zone of intersection.

In addition to or instead of symmetry with respect to the [100] or [110] direction of the wafer, the resonator may comprise an axis of symmetry which is perpendicular to that direction and/or perpendicular to the longitudinal direction of the beam. This is, however not necessary for the invention in general.

Due to practical limitations relating for example to implementing actuators of the resonator device, the doping concentration is typically higher than the $1.1*10^{20}$ cm$^{-3}$, this value representing a theoretical lower concentration limit for torsional modes as found by the inventors. For length-extensional and flexural modes, the lower concentration limit is roughly $1.2*10^{20}$ cm$^{-3}$. The concentration in practice may be for example $1.2*10^{20}$ cm$^{-3}$ or more for torsional modes and $1.3*10^{20}$ cm$^{-3}$ or more for length-extensional or flexural modes.

The resonator is preferably manufactured from a silicon wafer, in particular a homogeneously n-doped silicon wafer.

As briefly mentioned above, the resonance mode actuated to the beam can be length-extensional. This means that during oscillation, the dimension of the beam in its longitudinal direction is changed cyclically. The mode can also be flexural, whereby flexural cyclic movement takes place either in the plane of the wafer, out of the wafer plane or both. As a third option, the resonance mode is torsional.

In a preferred embodiment, the resonator element comprises a monolithic silicon crystal. The doping agent can be phosphorus, antimony or arsenic, for example.

According to one embodiment, the resonator element comprises a crystal grown by Czochralski method, in which the n-type doping agent is present already in the crystal growing stage. According to another embodiment; the resonator element comprises a crystal which is epitaxially grown with the n-type doping agent is present already at the growing stage. Both these methods result in a homogeneous doping of the crystal.

The silicon matrix is preferably doped with an n-type doping agent to an average doping concentration of at least $1.1*10^{20}$ cm$^{-3}$, which allows for not only full $1^{st}$ order temperature compensation, but also full $2^{nd}$ order compensation simultaneously. As briefly mentioned above, the doping concentration is typically higher, in particular $1.2*10^{20}$ cm$^{-3}$ or more, to take into account that in practical designs for example actuators, such as piezoelectric actuators typically move $TCF_1$ and $TCF_2$ values towards the negative direction, whereby the silicon crystal needs to be "overdoped" (compared with theoretical estimates neglecting e.g. actuators), so that $TCF_1$ and $TCF_2$ are above zero with high enough margin.

The doping concentration may be essentially homogeneous over the resonator element, but homogeneity in particular in the depth direction of the silicon wafer is not absolutely necessary. It is however preferred that the average n-doping concentration remains above the abovementioned thresholds.

It should be noted that the different portions of the resonator device are in practice acoustically coupled and therefore the flexural/torsional/length-extensional resonance mode excited to the tilted beam(s) may not be present in pure form. However, the flexural/torsional/length-extensional resonance dominates in the beam(s), i.e. mostly determine their mechanical movement and TCF characteristics. In practice, there may be deviation from the ideal behavior in particular at the intersecting zones of the different parts but the present invention covers such non-ideal resonances. A skilled person is able to distinguish between different modes even if not present in pure form.

Definitions

The term "beam" refers to a resonator element whose in-plane aspect ratio (length to width) is at least 2:1. Typically, the in-plane aspect ratio is at least 5:1. The aspect ratio can be for example 10:1 or more. The term out-of-plane aspect ratio refers to the ratio of height (out-of-plane dimension) to width of the beam. The out-of-plane aspect ratio is not critical for length-extensional or flexural modes, whereas for torsional modes, the out-of-plane aspect ratio is typically 2:1 . . . 1:2, in particular 1.5:1 . . . 1:1.5, such as 1:1.

The terms "flexural mode/resonance" cover, unless otherwise mentioned, flexural oscillations taking place in the lateral plane of the resonator device (in-plane mode) or at least partly out of that plane (out-of-plane mode).

The term "TCF characteristics" means the shape of the of the frequency vs temperature curve of the resonator, and in particular the combination of $1^{st}$ order and $2^{nd}$ order change of the resonance frequency of the resonator with temperature. The TCF characteristics of the present resonator is contributed by all portions thereof and in particular the beam(s). The term TCF characteristics, when referring to only a part of a multi-element resonator, means the TCF characteristics of a similar part if it was rigidly fixed to an imaginary line that connects the part to other parts.

Formulated mathematically, the definition of $TCF_1$ and $TCF_2$ is obtained from a power series representation of temperature dependent frequency f of a resonator:

$$f(T)=f_0[1+TCF_1 \times \Delta T+TCF_2 \times \Delta T^2],$$

where $\Delta T=T-T_0$ is the temperature differential, $f_0$ is the frequency at the reference temperature $T_0$ (for further details see e.g. A. K. Samarao at al, "*Passive TCF compensation in high q silicon micromechanical resonators,*" in *IEEE International Conference on Micro Electro Mechanical Systems* (*MEMS* 2010), Hong Kong, January 2010, pp. 116-119). If not otherwise mentioned, herein $T_0=25°$ C. is used.

The term "zeroing" of $TCF_1$ and/or $TCF_2$ in the present context means reduction of $TCF_1$ and/or $TCF_2$ below a predefined level of 1 ppm/C or 12 ppm/C$^2$, respectively, unless stricter limits are given. Unless otherwise indicated or clear from the context, the $TCF_1$ and $TCF_2$ values given and terms like "decrease", "reduce" and "increase" of $TCF_1$ or $TCF_2$ refer to their absolute values, i.e. deviation from zero. It should however be noted that both $TCF_1$ and $TCF_2$ can take a negative value (undercompensation) or positive value (overcompensation).

The notation X±Y means any value between and including X−Y and X+Y.

The terms "lateral" and "in-plane" herein mean directions in the plane of the resonator, i.e., typically co-planar with the wafer the resonator device is manufactured to.

"Main axis" of an element means an axis of elongation and/or symmetry of an element. For example main axes of a rectangle or square are oriented in the directions of the sides of the rectangle or square and coincide with its symmetry axis. The longitudinal axis of a beam is its main axis directed along the elongated direction (length direction) of the beam.

"Suspending" of a resonator means arranging the resonator in such a way that at least part of it is able to move with respect to the support structure in the desired resonance mode. Suspending can take place by joining a part of the resonator directly to the support structure or through one or more anchor elements, which are typically narrow bridges between the support structure and the resonator.

The term "nodal point" of a resonance mode covers, even if not explicitly mentioned, also points which as known in the art as quasinodal points.

Crystal directions are denoted with the bracket notation, e.g. [100]. By this notation any equivalent direction is meant: e.g. [100] is equivalent to [010] or [001].

Next, selected embodiments of the invention and advantages thereof are discussed in more detail with reference to the attached drawings.

BRIEF DESCRIPTION OF THE DRAWINGS

FIG. 3I shows graphs of temperature coefficients of the elastic parameters $c_{ij}$ of silicon as a function of doping concentration n.

DETAILED DESCRIPTION OF EMBODIMENTS

Figure 1A:
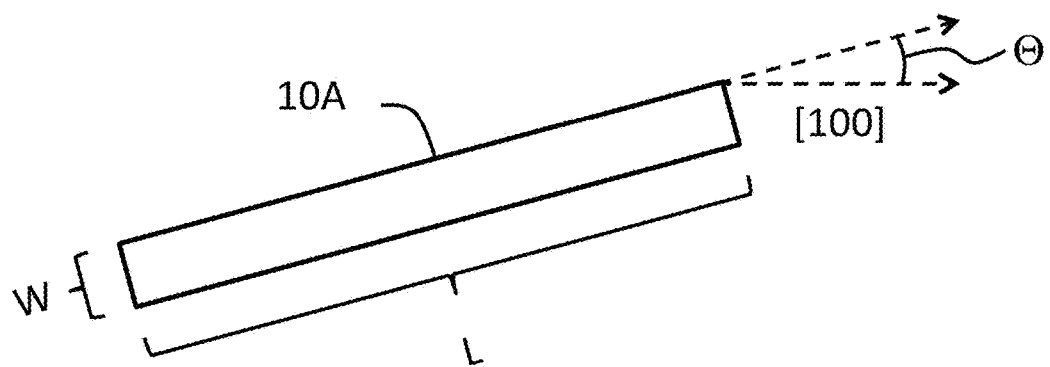
FIGS. 1A and 1B illustrate beam resonator geometries according to selected embodiments of the invention.

FIG. 1A shows a resonator consisting of a single beam 10A manufactured on a (100) wafer and having a length L and width W. The beam 10A is tilted with respect to the [100] crystal direction by an angle $\Theta$. The tilted beam 10A can be anchored to the surrounding support structure (not shown) from an anchoring point at one longitudinal end thereof or in the middle of one or both longitudinal sides, depending on the intended resonance mode to be excited. Preferably anchoring takes place at one or more nodal or quasinodal points of the resonance mode at the perimeter of the beam 10A.

A drawback in the resonator of FIG. 1A is that it is not symmetric with respect to the [100] direction, whereby parasitic resonance modes may arise in the beam along with the main resonance mode. These parasitic modes may decrease the quality factor of the resonator, and may even affect the TCF characteristics of the main resonance mode.

Figure 1B:
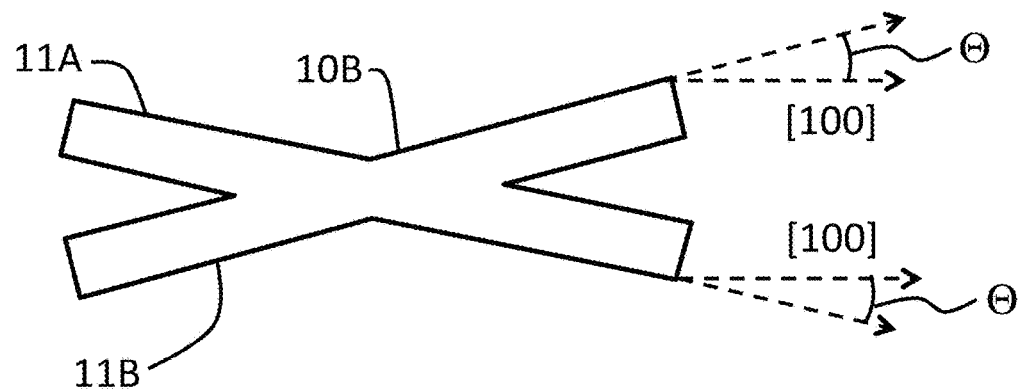

The resonator of FIG. 1B avoids the drawback. It comprises two tilted beams 11A, 11B crossing each other such that the resonator is symmetric with respect to the [100] crystal direction. Both beams 11A, 11B are tilted by angle $\Theta$ towards opposite directions. Herein, crossing of the beams 11A, 11B takes place in the middle of the beams, whereby the design is also symmetric with respect to the transverse direction, but geometries asymmetric with respect to that direction are possible too. Anchoring preferably takes place at the crossing zone of the beams 11A, 11B, leaving all four beam ends capable of resonating in a flexural, torsional or length-extensional mode in accordance with the invention.

According to a still further embodiment there is provided a mass element, such as rectangular, circular or elliptical mass element, at one or both ends of the beams 10A or 11A and/or 11B. Generally speaking, a mass element is an element having a width larger than the width of the beam. In such configuration, the tilted beam acts as a length-extensional, flexural or torsional spring between the substrate and the mass element, and its orientation with respect to the crystal contributes to minimizing the $TCF_1$ and $TCF_2$ of the resonator. A mass element can be added also to any other configuration comprising a tilted beam having a free end suitable for the mass element.

Figure 1C:
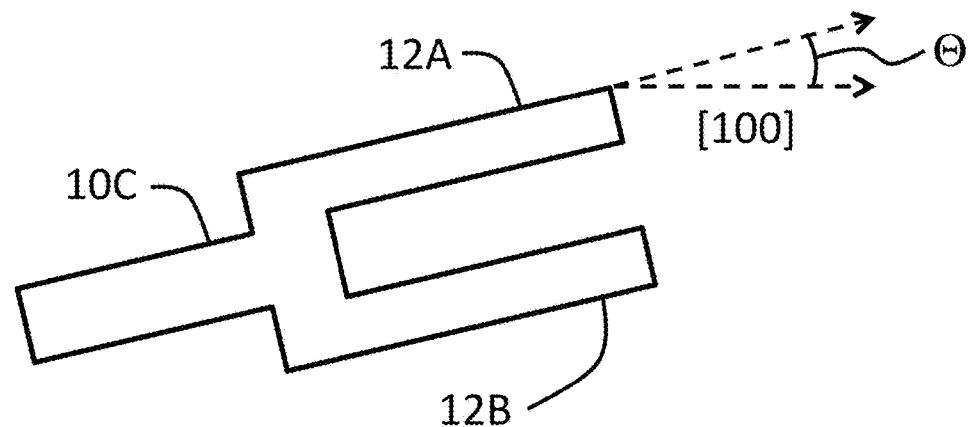
FIGS. 1C, 1D, 1G and 1H illustrate "tuning fork" resonator geometries according to selected embodiments of the invention.

FIG. 1C shows a tilted "tuning fork" design comprising a base beam 10C tilted by angle $\Theta$ with respect to the [100] crystal direction. The base beam 10C has two branches attached to it, namely a first fork beam 12A and a second fork beam 12B. The first and second fork beams 12A, 12B are both tilted at the same angle $\Theta$ and have a constant distance between them. As the fork beams 12A, 12B are suspended to the base beam 10C on one end thereof, they are capable of resonating in flexural, torsional or length-extensional modes in accordance with the invention.

Like in the design of FIG. 1A, the resonator of FIG. 1C is also not symmetric with respect to the [100] direction, and therefore non-optimal because of potential parasitic resonance modes excited.

Figure 1D:
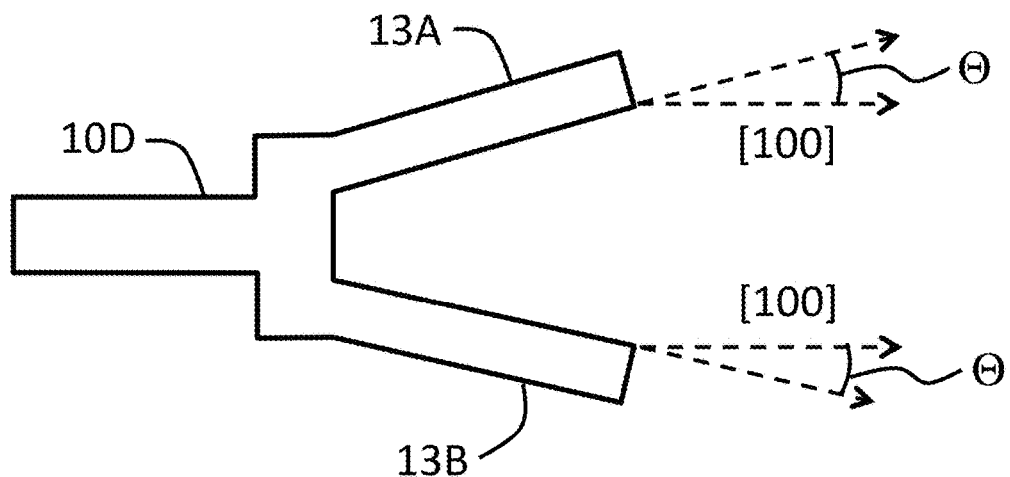

FIG. 1D shows a resonator with improved "tuning fork" geometry. Like above, the resonator comprises a base beam 10D and two fork beams 13A, 13B attached thereto. Now the base beam is oriented along the [100] direction and the fork beams 13A, 13B at an angle of $\Theta$ with respect to that direction, but at opposite sides thereof. This means that the fork beams 13A, 13B protrude away from each other, with an angle of $2\Theta$ between them. This design completely symmetrizes the resonator with respect to the [100] direction, thereby avoiding the arising of parasitic resonances. Still, both fork beams 13A, 13B are at an angle with respect to the crystal, thereby allowing for simultaneous zeroing of $TCF_1$ and $TCF_2$.

In the illustrated design, there is a transversely oriented section between the base beam 10D and the fork beams 13A, 13B, keeping the fork beams 13A, 13B separate from each other even close to the base beam 10D. This is, however, not absolutely necessary, but the fork beams 13A, 13B may also be located closer to each other.

In one variation of the symmetrized tuning fork geometry, the fork beams are tilted at the same angles Θ towards each other, such that their distance from each other comes shorter towards their ends.

Figure 1E:
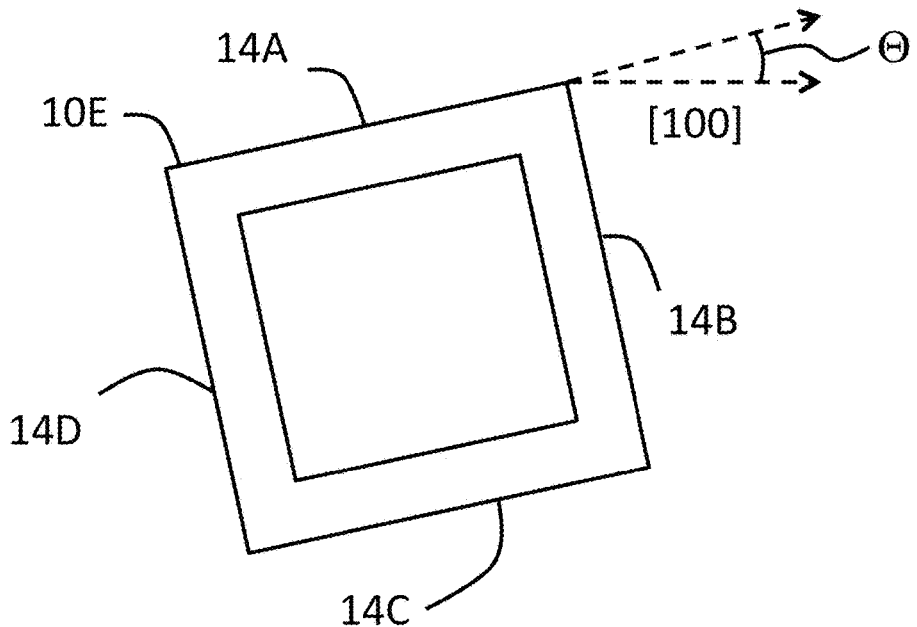
FIGS. 1E and 1F illustrate ring resonator geometries according to selected embodiments of the invention.
Figure 1F:
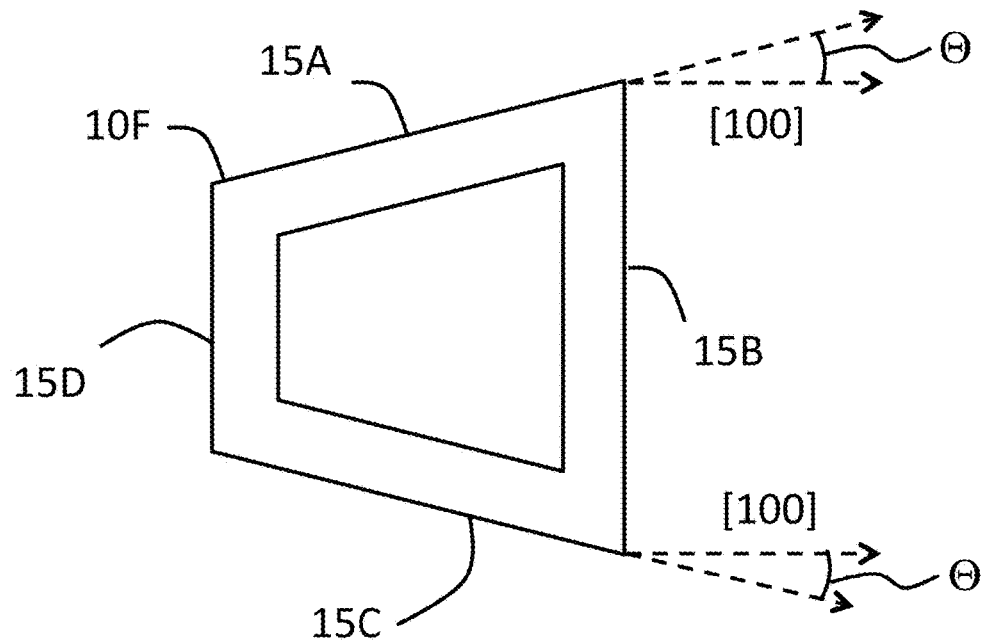
Figure 1G:
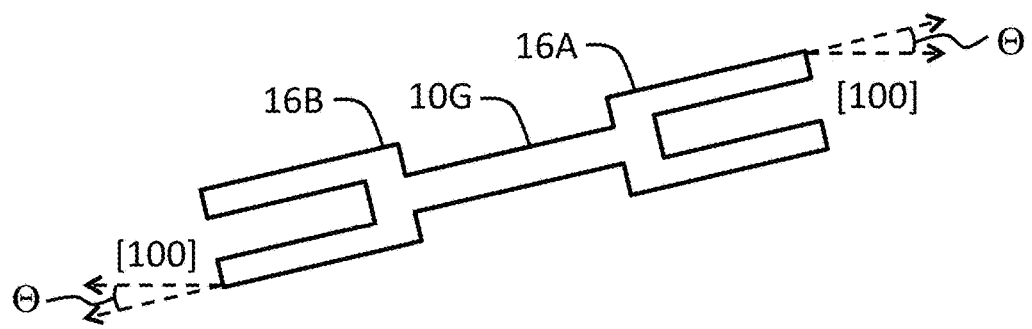

FIG. 1G shows a two-ended tuning fork resonator. There is a base beam 10G having two branched ends 16A, 16B with parallel fork beams, each end therefore corresponding to those described above in relation to FIG. 1C.

Figure 1H:
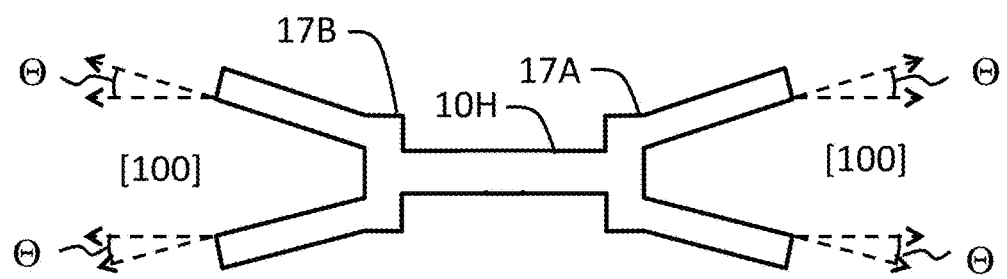

A crystal-symmetrized two-ended tuning fork resonator is shown in FIG. 1H. It comprises a [100]-aligned base beam 10H and two non-parallel fork beams at both ends 17A, 17B thereof. The fork beams are arranged pairwise in mirror symmetric configuration with respect to the [100] axis.

FIG. 1E shows a ring resonator embodiment. The ring resonator 10E comprises four beams 14A-D which are connected to each other from their ends such that a closed ring is formed. Two opposing beams 14A, 14C are oriented at an equal angle Θ with respect to the [100] crystal direction, whereas the two remaining beams 14B, 14D are at right angles with respect to those beams 14A, 14C.

As is the case with the designs of FIGS. 1A and 1C, the tilted beam portions allow for simultaneous zeroing of $TCF_1$ and $TCF_2$ in one or more resonance modes, but non-symmetry with respect to the crystal may cause parasitic resonances to emerge, decreasing the overall performance of the resonator.

A ring resonator can also be symmetrized, as shown in FIG. 1F. The resonator 10F comprises again four beams 15A-D connected to each other from their ends. Two opposing beams 15A, 15C of the ring formed are directed at opposite angles Θ with respect to the [100] direction. The remaining beams 15B, 15D are oriented at 90 degrees in-plane angle with respect to the [100] direction.

Ring resonators can be suspended at their central portion, in particular center-of-mass, using one or more anchor elements (not shown) extending from the support structure to the ring. Thus, the final structure resembles a cartwheel.

The invention is not limited to the geometric designs discussed above but there exists also other variations. In addition, the beams need not be exactly rectangular but may also be curved, involve width changes or have round corners, to mention some examples. In one embodiment, the resonator surface is free from trenches or perforations. However, the presence of such features is generally not excluded.

All the resonator geometries described above allow the tilted beams to be driven into flexural or length-extensional modes, in which case the doping concentration of $1.2*10^{20}$ cm$^{-3}$ or more, at least at the zone of the actual resonator, and a tilt angle Θ of 17±10 degrees in accordance with the invention can be used to minimize the overall TCF of the resonator device. At least some of the geometries are usable also for torsional-mode beam resonators, when the [100] direction is replaced with [110] direction. Typically, the whole resonator is homogeneously doped to the same concentration. The resonator can for example be manufactured from a doped single-crystal wafer.

Figure 2A:
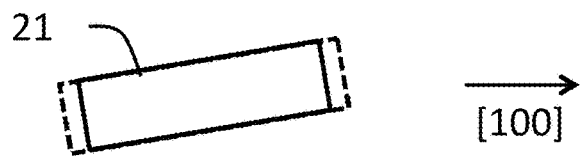
FIGS. 2A-2E illustrate behavior of beams according to various embodiments of the invention in different resonance modes.

FIG. 2A illustrates length-extensional resonance of a tilted beam 21. The solid lines represent the outer shape of the beam in contracted or normal (resting) state and dashed lines the shape of the beam in extended state.

Figure 2B:
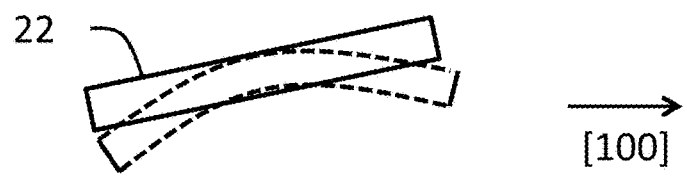

FIG. 2B illustrates in-plane flexural resonance of a tilted beam 22. The solid lines represent the outer shape of the beam in normal (resting) state and dashed lines the shape of the beam under flexure.

The modes of FIGS. 2A and 2B are applicable for the tilted (and also non-tilted) beams of FIGS. 1A-1D, 1G and 1H.

Figure 2C:
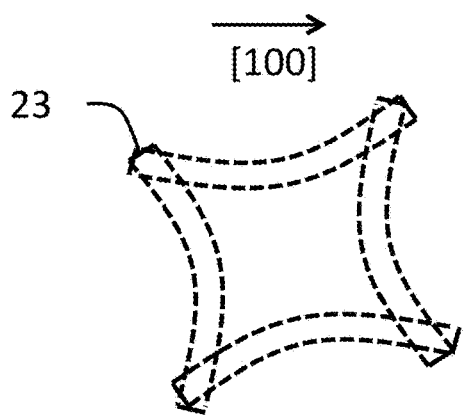
Figure 2D:
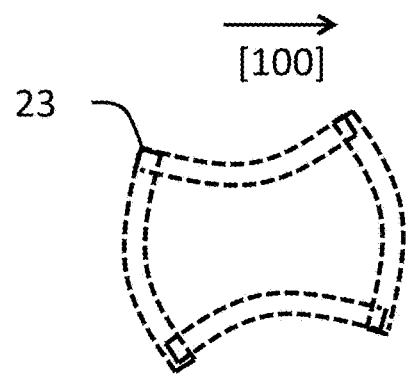

FIGS. 2C and 2D illustrate two in-plane flexural resonance modes of a ring beam resonator 23. In the mode of FIG. 2C, all beams bent inwards (towards the center of the ring) at the same time, whereas in the mode of FIG. 2D, the beams bend pairwise in opposite directions (inward and outwards). These modes are applicable for the resonators shown in FIGS. 1E and 1F.

Figure 2E:
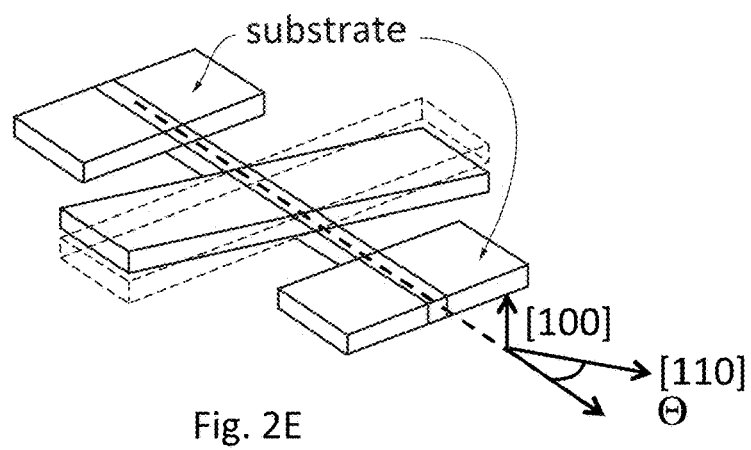

FIG. 2E illustrates an example of a torsional resonance mode, where a mass element is suspended between two torsional beams, which attach the resonator to the substrate. These beams are oriented along the dashed line, whose deviation from the 110 direction is given by Θ.

By choosing torsional beam dimensions (aspect ratio of the cross section of the beam), angle Θ and n-doping concentration suitably, not only $TCF_1$ of the resonator is zeroed but also $TCF_2$ is zeroed, giving the resonator a wide stable temperature range of operation.

Figure 3A:
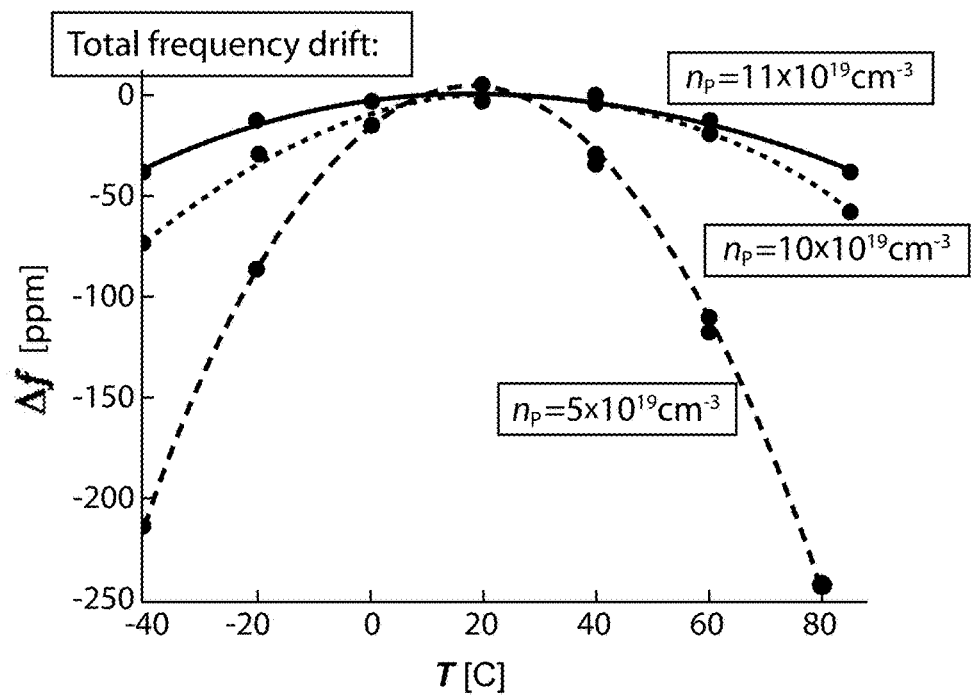
FIG. 3A illustrates a graph of total frequency drift vs. temperature for a WE mode resonator with optimized lateral aspect ratio at different doping concentrations.

FIG. 3A illustrates total frequency drift Δf vs, temperature T measured for an optimized SE/WE mode resonator (rectangular shape with aspect ratio ranging from 1 to 1.2 and sides in the [100] direction) at three different n-doping concentrations. As can be seen the opening curvature of the frequency-vs-temperature curve (i.e. $TCF_2$) decreases with increased doping level. In more detail, the evolution of $TCF_2$ is shown in FIG. 2B. Using a linear approximation in this optimal case, it can be estimated that $TCF_2$ is zeroed at approximately $1.2*10^{20}$ cm$^{-3}$. Taking into account practical factors that cause slow saturation of the $TCF_2$ behavior when the doping concentration is increased, the $TCF_2$ is zeroed in practice at $1.3*10^{20}$ or higher. Assuming that the second-order TCF grows monotonously when doping gets larger than $11*10^{19}$, and that the linear TCF gets smaller simultaneously, there exist a doping level and a single point (=a definite aspect ratio) on the WE-SE continuous branch, where both $TCF_1$ and $TCF_2$ are zero.

FIG. 3A shows that a total frequency drift of less than 50 ppm over the industrial range of −40 . . . 85 C can be achieved with optimized geometry when the doping concentration is in the range according to the invention. Further extrapolation using the data shown in FIG. 3B on the other hand supports that a drift of less than 25 ppm is feasible.

Figure 3B:
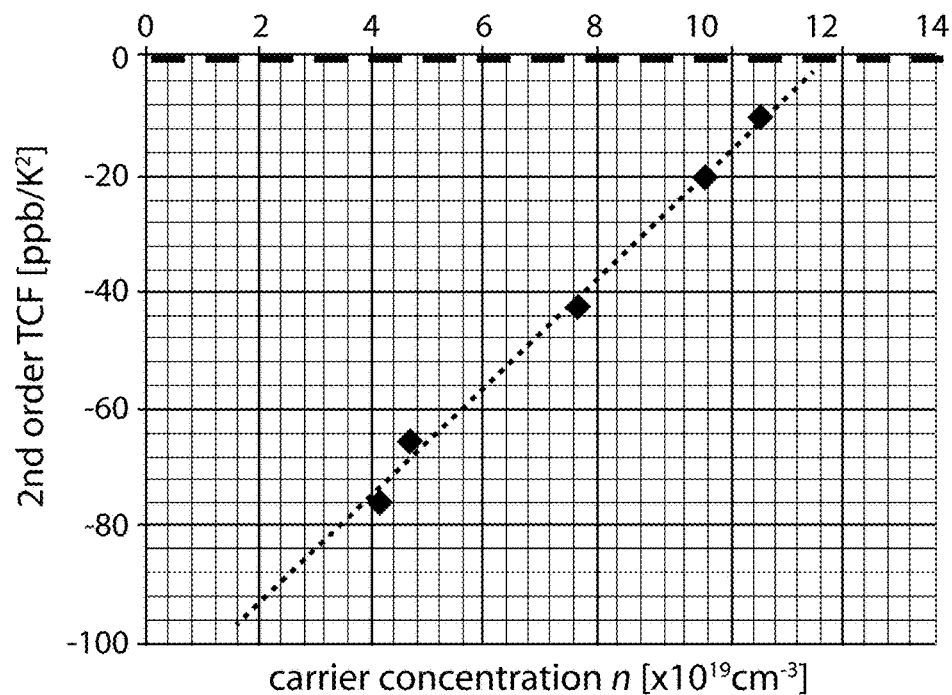
FIG. 3B shows a graph of second order TCF vs. doping concentration for a WE resonator whose linear TCF is made zero by optimal design.

The experimental data of FIGS. 3A and 3B has been measured for SE/WE mode branch, but flexural/torsional modes provide the same kind of behavior, because temperature dependence of a correctly oriented beam resonator according to the present invention is very similar to that of a WE mode. Data from flexural modes was not measured (and the WE modes are measured instead) since in practical atmospheric-pressure characterization measurements, high-frequency (>10 MHz) WE modes have relatively high Q values of the order of 10000. Flexural modes (typically <1 MHz.) suffer from strong gas damping, and therefore they cannot be measured in open air.

The qualitative results shown in the following figures and explained below for the various modeshapes within the scope to the invention further demonstrate the feasibility of the invention.

Figure 3C:
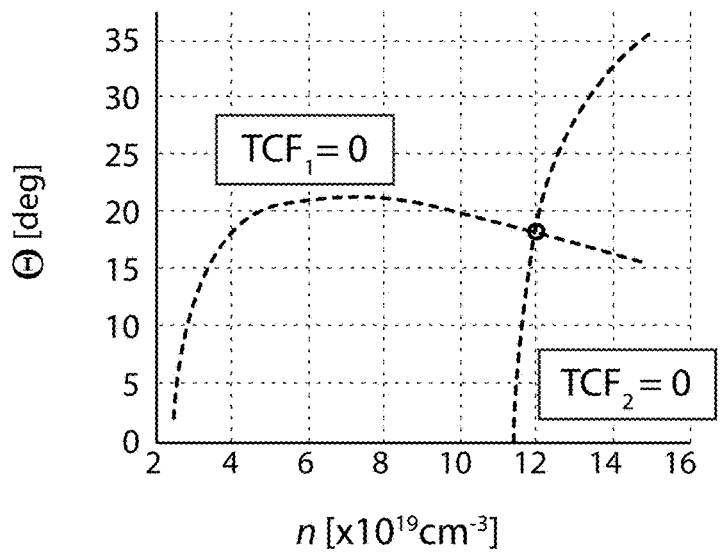
FIGS. 3C and 3D show $TCF_1=0$ and $TCF_1=0$ curves of a [100]-oriented beam in length-extensional $1^{st}$ order and $3^{rd}$ order resonances, respectively, in a plane defined by doping concentration and rotation angle of the beam.

FIG. 3C shows zero $TCF_1$ and $TCF_2$ curves of a simple 1$^{st}$ order length-extensional beam resonator (according to FIG. 1A) when the n-doping concentration and rotation angle Θ are varied. As can be seen, both $TCF_1$ and $TCF_2$ are zeroed simultaneously at about $1.2*10^{20}$ cm$^{-3}$ concentration and 17 degrees angle. For other geometries herein disclosed, optimal combination can be found when the doping concentration is $1.2*10^{20}$ cm$^{-3}$ or higher and the angle is 7-27 degrees with respect to the [100] direction of the wafer.

FIG. 3C represents an optimal situation for a doped silicon resonator element. In practice, additional materials which must be present in order to provide an operational actuator, change the position of the curves to some extent. For example, a metal electrode and a piezoelectric material layer required for piezoactuation move the curves towards the right hand side and down. Consequently, the $TCF_1=TCF_2=0$ point, where the curves intersect, moves towards higher concentration and lower angle. For a rectangular beam in the length-extensional mode, the optimal point in practice can be for example at a concentration of $1.3*10^{20}$ cm$^{-3}$ or higher, and the angle being 7-20 degrees, such as 7-17 degrees.

Figure 3D:
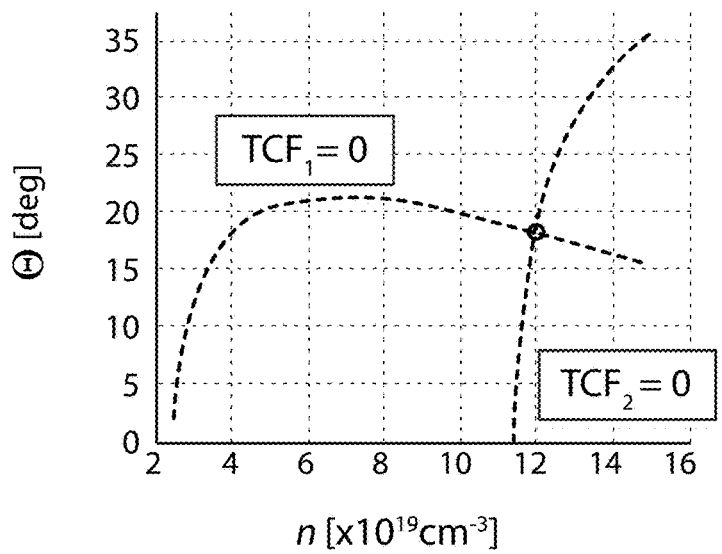

FIG. 3D shows a graph similar to that of FIG. 3C but for a $3^{rd}$ order length-extensional mode. The form of the curve is similar to that of FIG. 3C and the above considerations apply. This shows that the invention is not limited to $1^{st}$ order resonance modes.

Figure 3E:
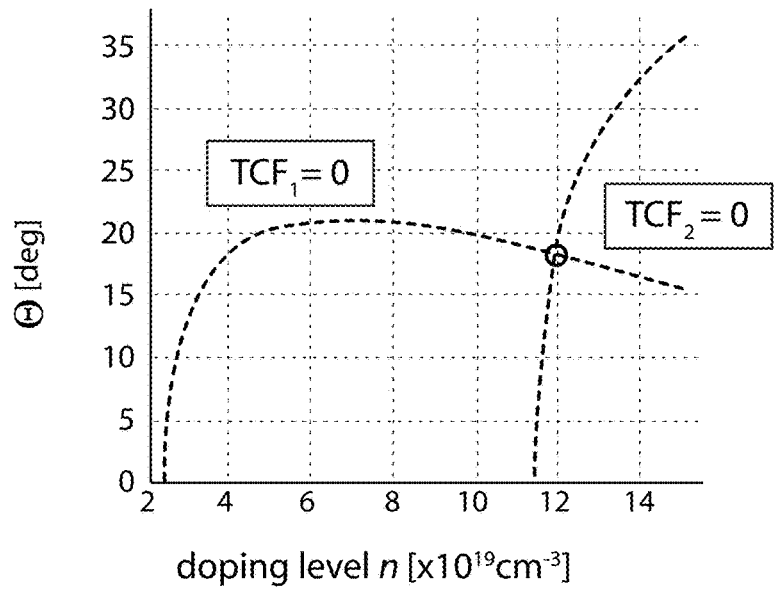
FIGS. 3E and 3F show $TCF_1=0$ and $TCF_2=0$ curves of a [100]-oriented beam in flexural $1^{st}$ order and $5^{th}$ order resonances, respectively, in a plane defined by doping concentration and rotation angle of the beam.
Figure 3F:
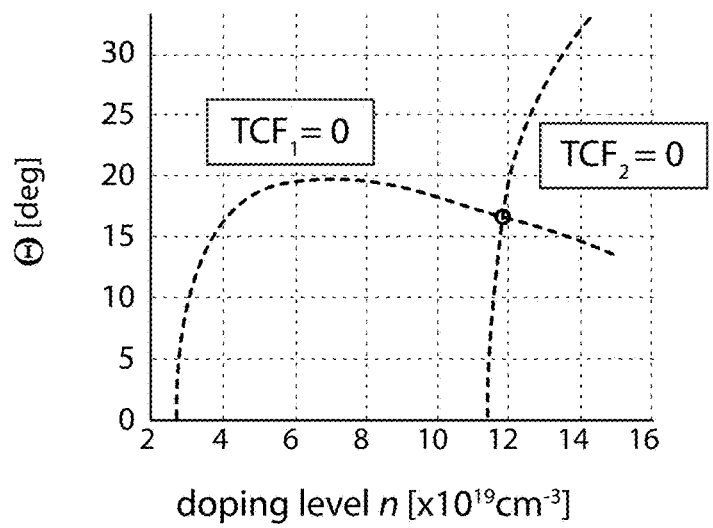

FIGS. 3E and 3F show $TCF_1=TCF_2=0$ curves for $1^{st}$ and $5^{th}$ order flexural mode resonators. The behavior is analogous to that of length-extensional modes as far as the optimal angle and doping concentration are concerned.

The examples described above are presented for resonators manufactured on a (100) wafer. The same principles of design can be used for resonators manufactured on (110) wafers.

Figure 3G:
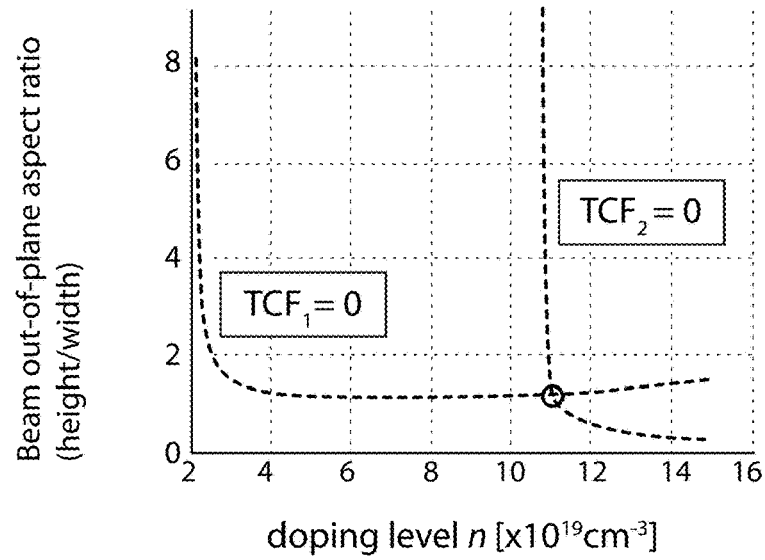
FIGS. 3G and 3H show $TCF_1=0$ and $TCF_2=0$ curves of a [110]-oriented beam manufactured on a (100) wafer and (110) wafer, respectively, in torsional resonance in a plane defined by doping concentration and out-of-plane aspect ratio of the beam.
Figure 3H:
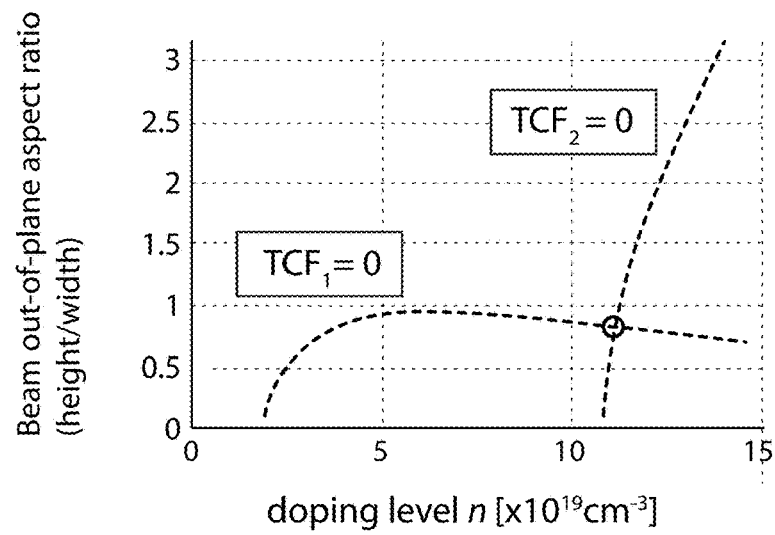
Figure 31:
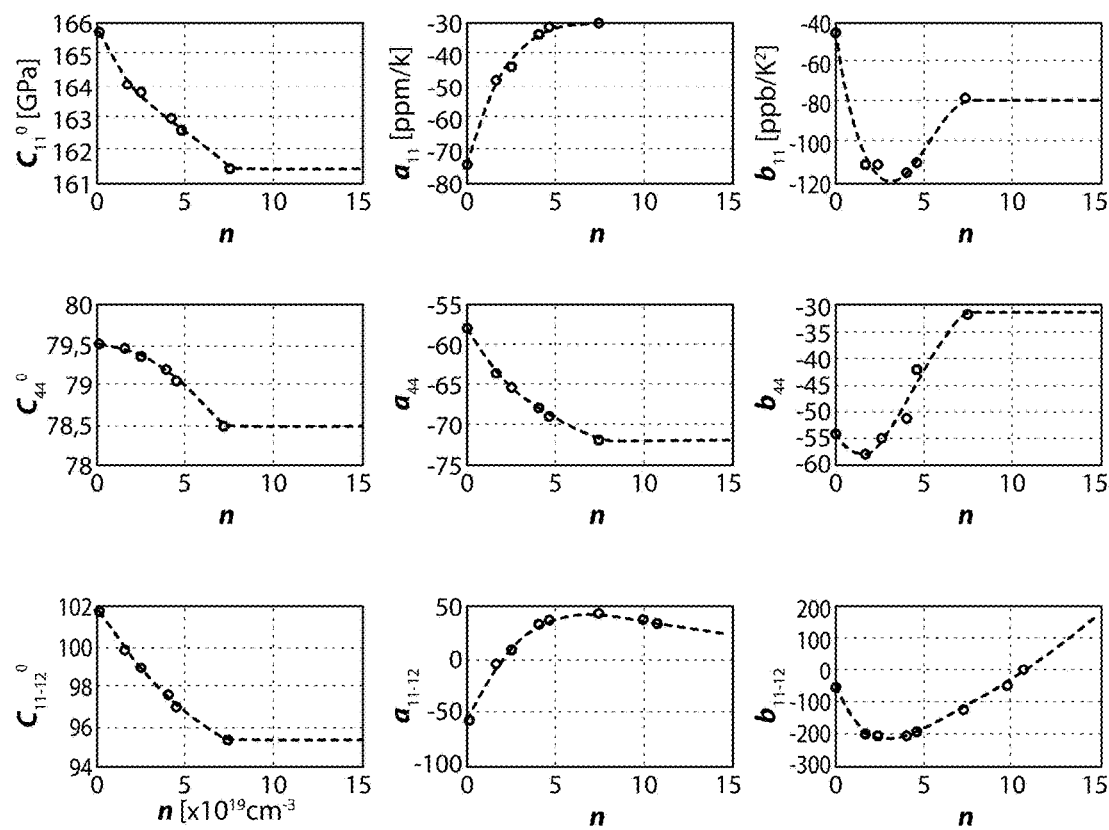

FIGS. 3G and 3H show curves analogous to those of FIG. 3C-3F but for a torsional mode beam resonator in two different wafer planes, i.e, (110) and (100), respectively, and using the out-of-plane cross sectional aspect ratio of the beam (beam height/beam width) at the vertical axis. Similar behavior applies to resonator geometries which comprise a torsional spring or a multitude of torsional springs, such as that illustrated in FIG. 2E. It can be seen that the optimal TCF point is found in both cases at about a concentration of $1.11*10^{20}$ cm$^{-3}$ or higher and when the out-of-plane aspect ratio is close to 1 (but not exactly 1). Zeroing the TCFs simultaneously in the torsional resonance mode is not as angle-sensitive as in the LE or flexural modes: if the beam orientation deviates from [110] within of −35 . . . 35 degrees, an optimal aspect ratio can be used to obtain $TCF_1=TCF_2=0$. These optimal configurations are illustrated in FIGS. 3K and 3L as a function of the deviation angle θ from [110]. It is seen that the aspect ratio is approximately 1 (about 1.2 or 0.85, depending on the wafer plane) for a beam aligned with [110], and that it is decreased when the orientation is deviated from [110].

It should also be noted that in the case of torsional beams, the optimal solution never occurs with the combination of aspect ratio 1 and angle 0, but with other parameter combinations. To give some further details on how the curves of FIGS. 3C-3H are generated, FIG. 3I shows the temperature coefficients of the elastic parameters as a function of carrier concentration n. The first, second and third column represent the constant terms $c^0_{ij}$, linear coefficients $a_{ij}$, and second-order coefficients $b_{ij}$ at T=25° C., respectively. $c^0_{11-12}$, $a_{11-12}$ and $b_{11-12}$ are shorthands for the coefficients of $c_{11}-c_{12}$. The dependent coefficient $a_{12}$ is readily evaluated as $a_{12}=(a_{11}c^0_{11}-a_{11-12}c^0_{11-12})/c^0_{12}$, and a similar equation holds for $b_{12}$. Data points at carrier concentration below $7.5*10^{19}$ cm$^{-3}$ represent data from literature (Jaakkola et al, "Determination of doping and temperature dependent elastic constants of degenerately doped silicon from MEMS resonators," IEEE Transactions on Ultrasonics, Ferroelectrics, and Frequency Control. IEEE. Vol. 61 (2014) No: 7, 1063-1074). Data points for $1^{st}$ and $2^{nd}$ order coefficients $a_{11-12}$ and $b_{11-12}$ at carrier concentration $10*10^{19}$ cm$^{-3}$ and $11*10^{19}$ cm$^{-3}$ are shown with circles as well; these data points are based on recent measurement results of the applicant, shown in FIG. 3J, and importantly show the property of values of $b_{11-12}$ following the positive slope that starts from a dopant concentration below $5*10^{19}$ cm$^{-3}$. In calculations for producing results of FIGS. 3C-3H, the interpolated/extrapolated values represented by the dashed curves of FIG. 3I have been used.

The fit at carrier concentration $0<n<7.5*10^{19}$ cm$^{-3}$ is based on a third order polynomial fit to the data points at carrier concentration $0<n<7.5*10^{19}$ cm$^{-3}$ for all nine terms shown in the plot. The fit of $a_{11-12}$ and $b_{11-12}$ at carrier concentration $n>=7.5*10^{19}$ cm$^{-3}$ is based on a linear fit to the three data points available on this range. For other terms except $a_{11-12}$ and $b_{11-12}$ the values are assumed to stay at the same level as the experimental data at $n=7.5*10^{19}$ cm$^{-3}$. Hence, for these cases, the dashed line is horizontal for $n>7.5*10^{19}$ cm$^{-3}$. Reason for this choice was that no experimental data exists for other than terms $a_{11-12}$ and $b_{11-12}$ at carrier concentrations above $7.5*10^{19}$ cm$^{-3}$. As a result, the results of FIGS. 3C-3H are not expected to be quantitatively perfectly accurate, but they do demonstrate the existence of optimal configurations where $TCF_1$ and $TCF_2$ can be zeroed simultaneously. Also, as the main terms contributing to the temperature coefficients of the resonance modes discussed in this document are $a_{11-12}$ and $b_{11-12}$, it is justified to assume that predictions of FIGS. 3C-3H hold fairly well.

Figure 3J:
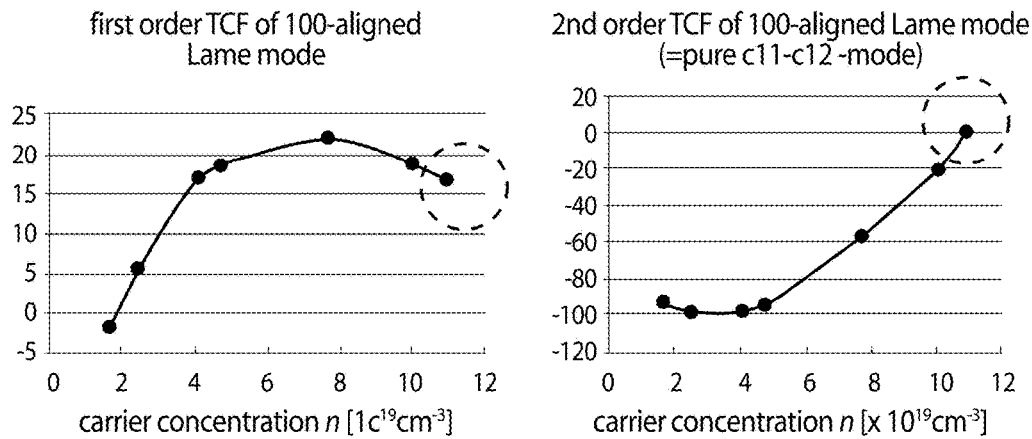
FIG. 3J shows measured first and second order TCF of a Lame mode with the plate sides in [100]-orientation as a function of carrier concentration. The two data points with the highest carrier concentration ($n>=10e19$ $cm^{-3}$) were first discovered in connection with the present invention.
Figure 3K:
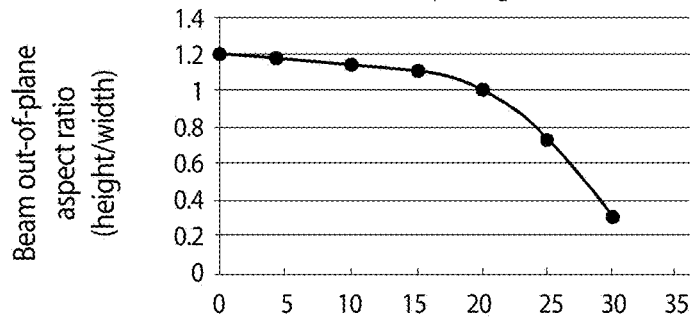
FIGS. 3K and 3L show $TCF_1=0$ and $TCF_2=0$ curve of a $1^{st}$ order torsional mode beam in (110) plane and (100) plane, respectively, as graphs with axes defined by optimal out-of-plane aspect ratio of the beam and deviation (n) of the beam length from [110] direction, when the doping concentration is $1.11*10^{20}$ $cm^{-3}$.
Figure 3L:
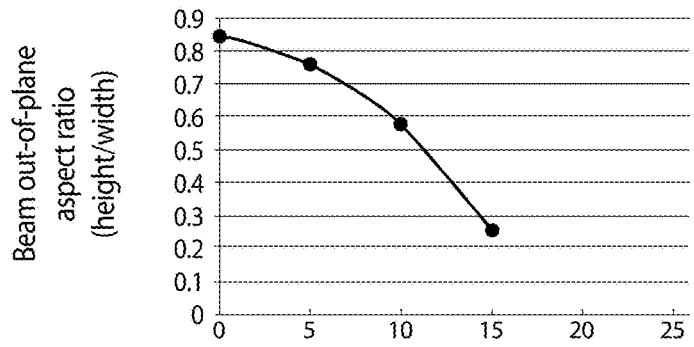

FIG. 3J shows the experimental data measured for a Lame-mode resonator, which is aligned with the [100] crystalline direction so that its modal frequency is dependent solely on the elastic parameter difference term $c_{11}-c_{12}$. Data points for doping concentration $n<7.5*10^{19}$ cm$^{-3}$ are from literature (Jaakkola et al, "Determination of doping and temperature dependent elastic constants of degenerately doped silicon from MEMS resonators," IEEE Transactions on Ultrasonics, Ferroelectrics, and Frequency Control. IEEE. Vol. 61 (2014) No: 7, 1063-1074), but the two data points with the highest doping concentration have not previously been published. Based on the experimental data, it can be expected that the $2^{nd}$ order TCF of the [100]-aligned Lame mode resonator attains even more positive values at higher dopant levels. This has indeed been assumed in FIG. 3I, where the behavior of the $b_{11-12}$ term has been extrapolated.

It should be understood that the invention covers a large number of different resonance frequencies, doping concentrations, geometrical configurations (including lateral shape and thickness) of the resonator, only some of which are exemplified in the drawings or in the present description. Common to them is that the resonator comprises a beam section, the properties of which are within the claimed doping concentration and angle ranges and the beam section therefore working together with potential other parts of the resonator to minimize the overall temperature dependency of the resonance frequency of the resonator. It should be noted that is not possible to cover all possible parameter combinations in detail, but using the principles herein disclosed a skilled person is able to find specific parameter combinations that suits his needs.

In addition to the n-type dopant, there may be p-type dopant present in the resonator. There may for example be a homogeneous p-type background doping in the crystal.

The actuator of the present micromechanical resonator can be for example a piezoelectric actuator or electrostatic actuator, or any other actuator suitable for exciting resonance modes known per se. According to one embodiment, the actuator comprises a piezoelectric actuator positioned on top of the resonating element. The piezoelectric actuator may comprise for example an aluminum nitride (AlN) layer and a molybdenum electrode. In configurations symmetrized along a symmetry axis, two or more actuators may also be placed symmetrically with respect to that axis in order to maintain symmetry of the resonator device. Both piezoelectric and electrostatic actuators are known per se and applicable to the present resonator design by a skilled person and not discussed herein in further detail.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of lengths, widths, shapes, etc, to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The invention claimed is:

1. A microelectromechanical resonator device comprising,
   a support structure,
   a resonator suspended to the support structure and having at least one beam, the beam;
     having a longitudinal axis,
     being doped to a doping concentration with an n-type doping agent, and
     being capable of resonating in a length-extensional, flexural or torsional resonance mode,
   an actuator for exciting said length-extensional, flexural or torsional resonance mode into the resonator,
   wherein the support structure and the resonator are manufactured from a (100) oriented semiconductor wafer or a (110) oriented semiconductor wafer,
   wherein said doping concentration is at least $1.1*10^{20}$ cm$^{-3}$, and
   wherein the longitudinal axis of the beam is oriented
     at an angle of 17±10 degrees with respect to the [100] crystal direction of the wafer if said resonance mode is length-extensional or flexural, and
     at an angle of 0±35 degrees with respect to the [110] crystal direction of the wafer if said resonance mode is torsional.

2. The resonator device according to claim 1, wherein the resonator includes only one beam.

3. The resonator device according to claim 2, wherein the resonator is essentially comprised of said beam.

4. The resonator device according to claim 1, wherein the resonator includes at least two beams having longitudinal axes at an angle with respect to each other.

5. The resonator device according to claim 1, wherein
   the resonator includes at least two beams whose longitudinal axes are oriented at said angle, and
   the whole resonator has an axis of symmetry which is essentially parallel with the [100] direction if said resonance mode is length-extensional or flexural or [110] direction if said resonance mode is torsional.

6. The resonator device according to claim 4, wherein the beams are connected to each other from their ends.

7. The resonator device according to claim 6, further comprising three, four or more beams arranged in ring formation.

8. The resonator device according to claim 4, wherein the at least two beams
   are from their first ends connected to a common base portion having an axis of symmetry essentially parallel with the [100] direction if said resonance mode is length-extensional or flexural or [110] direction if said resonance mode is torsional, and
   extend from the common base portion at equal angles with respect to the [100] or [110] direction, respectively, but at opposite sides of said direction in the plane of the wafer.

9. The resonator device according to claim 4, wherein the beams intersect each other and are suspended to the support structure at their zone of intersection.

10. The resonator device according to claim 1, wherein the resonator comprises an axis of symmetry which is perpendicular to the longitudinal direction of the beam.

11. The resonator device according to claim 1, wherein said resonance mode is length-extensional.

12. The resonator device according to claim 1, wherein said resonance mode is flexural, the flexural plane being in the wafer plane and/or out of the wafer plane.

13. The resonator device according to claim 11, wherein said angle is 17±8 degrees with respect to the [100] crystal direction.

14. The resonator device according to claim 1, wherein the resonance mode is torsional.

15. The resonator device according to claim 14, wherein an out-of-plane aspect ratio of the at least one beam is less than 2.

16. The resonator device according to claim 14, wherein the beam is manufactured in (110) wafer plane and the longitudinal axis of the beam is oriented at 0±35 degrees with respect to the [110] crystal direction, or the beam is manufactured in (100) wafer plane and the longitudinal axis of the beam is oriented at 0±20 degrees with respect to the [110] crystal direction.

17. The resonator device according to claim 14, wherein the beam is manufactured in (110) wafer plane and its out-of-plane aspect ratio is 1.25 or less, or the beam is manufactured in (100) wafer plane and its out-of-plane aspect ratio is 0.9 or less.

18. The resonator device according to claim 14, wherein the angle of the beam deviates from the [110] crystal direction by at least 5 degrees.

19. The resonator device according to claim 1, wherein said doping concentration is at least $1.2*10^{20}$ cm$^{-3}$.

20. The resonator device according to claim 1, wherein the in-plane aspect ratio of the at least one beam is 5:1 or more.

21. The resonator device according to claim 1, wherein the first order temperature coefficient of frequency ($TCF_1$) of the resonator is 1 ppm/C or less at at least the one temperature and a second order temperature coefficient of frequency ($TCF_2$) is 12 ppb/C$^2$ or less at said temperature.

22. The resonator device according to claim 1, wherein said actuator comprises a piezoelectric actuator acoustically coupled with the beam.

* * * * *